(12) United States Patent (10) Patent No.: US 8,728,338 B2
Ohmi et al. (45) Date of Patent: May 20, 2014

(54) ULTRA HIGH-SPEED WET ETCHING APPARATUS

(71) Applicant: National University Corporation of Tohoku University, Sendai (JP)

(72) Inventors: Tadahiro Ohmi, Sendai (JP); Tomotsugu Ohashi, Sendai (JP); Kazuhiro Yoshikawa, Sendai (JP); Tetsuro Yoshida, Sendai (JP); Teppei Uchimura, Sendai (JP); Kazuki Soeda, Sendai (JP)

(73) Assignee: National University Corporation Tohoku University, Miyagi (JP)

( * ) Notice: Subject to any disclaimer, the term of this patent is extended or adjusted under 35 U.S.C. 154(b) by 0 days.

(21) Appl. No.: 13/887,730

(22) Filed: May 6, 2013

(65) Prior Publication Data

US 2013/0244442 A1 Sep. 19, 2013

Related U.S. Application Data

(63) Continuation-in-part of application No. PCT/JP2011/006234, filed on Nov. 8, 2011.

(30) Foreign Application Priority Data

Nov. 12, 2010 (JP) ................................. 2010-254114
May 12, 2011 (JP) ................................. 2011-107619

(51) Int. Cl.
 *B44C 1/22* (2006.01)
 *C03C 15/00* (2006.01)
 *C03C 25/68* (2006.01)
 *C23F 1/00* (2006.01)

(52) U.S. Cl.
 USPC ............................................................ 216/92

(58) Field of Classification Search
 CPC ..................... H01L 21/6708; H01L 21/31111; H01L 21/32134; H01L 21/30604; Y10S 134/902
 USPC .................................. 216/83, 91, 92; 438/748
 See application file for complete search history.

(56) References Cited

U.S. PATENT DOCUMENTS

2010/0029088 A1 * 2/2010 Mayer et al. ................... 438/748

FOREIGN PATENT DOCUMENTS

| JP | 2000-160367 | | 6/2000 |
|---|---|---|---|
| JP | 2001351847 A | * | 12/2001 |
| JP | 2007-207810 | | 8/2007 |
| JP | 2009-135396 | | 6/2009 |
| JP | 2010-177541 | | 8/2010 |

* cited by examiner

*Primary Examiner* — Roberts Culbert
(74) *Attorney, Agent, or Firm* — Fitzpatrick, Cella, Harper & Scinto (57) ABSTRACT

There is provided with an etching method using an etching apparatus. Four arms can be positioned in a direction substantially from a center of the stage toward a peripheral portion with an angle difference of about 90°. Etchant is supplied to a first position nearest to the center of the object which is rotating, from a first etchant supply nozzle placed on a first arm. Etchant is further supplied to a second position second nearest to the center of the object, from a second etchant supply nozzle placed on a second arm. The second arm is substantially symmetrically positioned with respect to the first arm and the second arm has an angle difference of about 180° with respect to the first arm.

7 Claims, 8 Drawing Sheets

ULTRA HIGH-SPEED WET ETCHING APPARATUS

BACKGROUND OF THE INVENTION

1. Field of the Invention

The present invention relates to an ultra high-speed wet etching apparatus for performing uniform, high-speed wet etching of a silicon substrate using an etchant containing hydrofluoric acid (HF) and nitric acid ($HNO_3$).

2. Description of the Related Art

In recent years, semiconductor devices driven by a low voltage have been required in terms of energy saving and global popularization of mobile terminal devices. One technical problem in driving a semiconductor device by a low voltage is to decrease the thickness of a silicon substrate for forming a semiconductor device. In the field of power devices, for example, a silicon substrate is required to have a thickness of 50 μm to 100 μm. In a DRAM or flash memory, the memory density is improved by causing an electrode (Through Silicon Via (TSV)) to extend between the upper and back surfaces of a substrate, and forming the memory to have a multi-layer structure. To drive the device by a lower voltage, and increase the memory density, a silicon substrate has been strongly required to have a thickness as small as 20 μm to 30 μm.

A technique of decreasing the thickness of a silicon substrate includes arranging a power device and memory on the front surface of the silicon substrate, mechanically polishes the back surface of the silicon substrate to a predetermined thickness by back grinding using abrasive polishing grains, and then performs wet etching.

SUMMARY OF THE INVENTION

Technical Problem

Problems to be solved arise in the use of mechanical polishing and wet etching. That is, mechanical polishing unwantedly forms a so-called damaged layer including damage, and it takes too long to decrease the thickness of the silicon substrate. Therefore, the invention of a new technique of decreasing the thickness of a silicon substrate to a required thickness in an extremely short time without causing any damage to the silicon substrate when manufacturing a semiconductor device is an urgent matter.

The prevent invention provides an ultra high-speed wet etching apparatus capable of almost uniformly etching and removing a silicon substrate using fluonitric acid as an etchant at a speed of 400 μm/min or higher.

Solution to Problem

According to one aspect of the present invention, an etching method using an etching apparatus is provided, wherein the etching apparatus comprises:

a rotatable stage where an object to be etched is placed; and four arms comprising an etchant supply nozzle for supplying etchant to a surface to be etched on the object;

wherein the four arms can be positioned in a direction substantially from a center of the stage toward a peripheral portion with an angle difference of about 90°; and wherein the etching method comprises:

supplying the etchant to a first position nearest to the center of the object which is rotating, from a first etchant supply nozzle placed on a first arm;

supplying the etchant to a second position second nearest to the center of the object, from a second etchant supply nozzle placed on a second arm, wherein the second arm is substantially symmetrically positioned with respect to the first arm and the second arm has an angle difference of about 180° with respect to the first arm;

supplying the etchant to a third position on the object from a third etchant supply nozzle placed on a third arm, wherein the third arm is positioned between the first arm and the second arm;

supplying the etchant to a fourth position of the object from a fourth etchant supply nozzle placed on a fourth arm, wherein the fourth arm is substantially symmetrically positioned with respect to the third arm;

supplying the etchant to a fifth position of the object from a fifth etchant supply nozzle placed on the second arm;

supplying the etchant to a sixth position of the object from a sixth etchant supply nozzle placed on the first arm.

According to another aspect of the present invention, an etching method using an etching apparatus is provided, wherein the etching apparatus comprises:

a rotatable stage where an object to be etched is placed; and a plurality of arms comprising an etchant supply nozzle for supplying etchant to a surface to be etched on the object;

wherein the plurality of arms can be positioned in a direction substantially from a center of the stage toward a peripheral portion with a substantially uniformed angle difference; and wherein the etching method comprises:

supplying the etchant to a position nearest to the center of the object which is rotating, from a first etchant supply nozzle placed on a first arm out of the plurality of arms;

supplying the etchant to a position second nearest to the center of the object, from a second etchant supply nozzle placed on a second arm, wherein the second arm has the largest angle difference with respect to the first arm; and supplying the etchant to a position on the surface to be etched on the object which is different from the positions to which the etchant is supplied from the first etchant supply nozzle or the second etchant supply nozzle, from a third etchant supply nozzle on a third arm which placed between the first arm and the second arm;

wherein the second etchant supply nozzle and the third etchant supply nozzle supply the etchant with tilt angles with respect to a rotating direction of the object; and wherein the outer etchant supply nozzle supplies the etchant with the smaller tilt angle with respect to the rotating direction of the object.

Advantageous Effects of Invention

According to the present invention, since no mechanical polishing is used, it is possible to decrease the thickness of a silicon substrate to 50 μm to 100 μm or 20 μm to 30 μm within a time as extremely short as about one minute by only wet etching without causing any damage to a device, thereby establishing a manufacturing technique with significantly high productivity.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

A preferable embodiment of the present invention will be described below with reference to the accompanying drawings.

Figure 1:
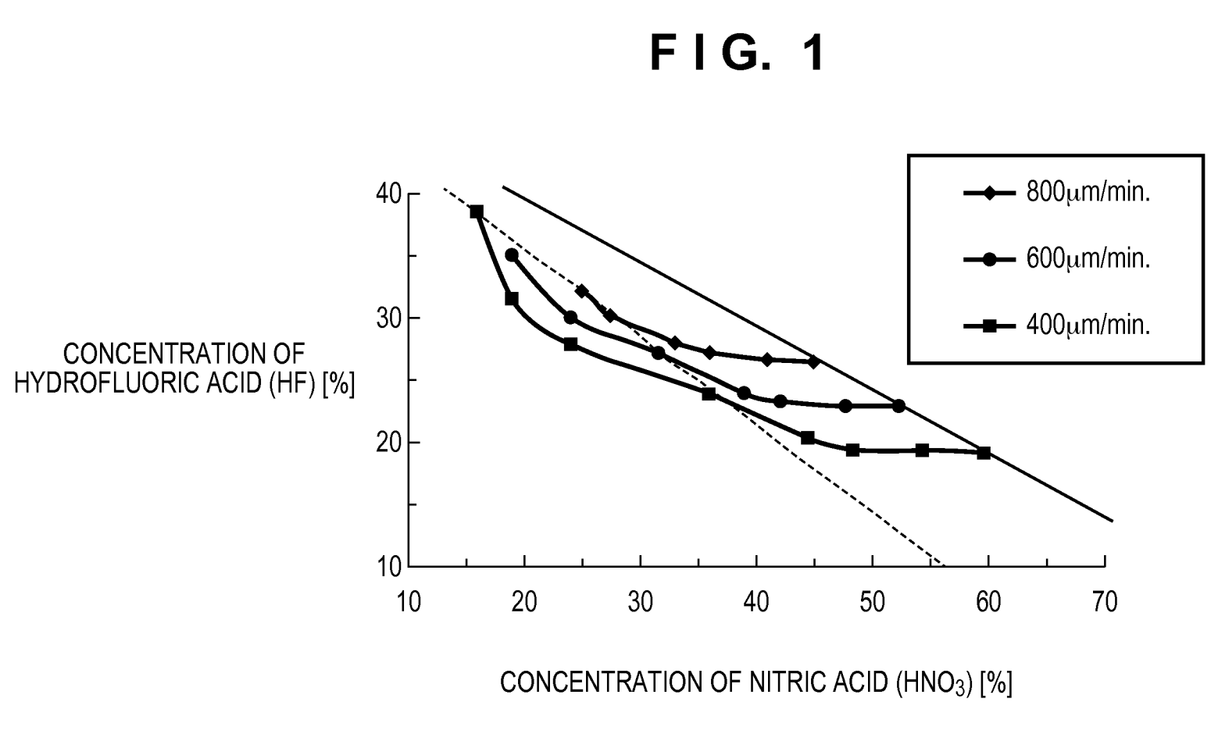
FIG. 1 is a graph showing the relationship between the etching speed of a silicon substrate and the concentrations of hydrofluoric acid (HF) and nitric acid ($HNO_3$) on an etchant containing HF and $HNO_3$.

FIG. 1 is a graph showing the relationship between the etching speed of a silicon substrate and the concentrations of hydrofluoric acid (HF) and nitric acid ($HNO_3$) in an etchant containing HF and $HNO_3$. A silicon etching speed by an HF (30 wt %)-$HNO_3$ (28 wt %) solution, an HF (2 wt %)-$HNO_3$ (36 wt %) solution, or an HF (26.5 wt %)-$HNO_3$ (45 wt %) solution reaches 800 μm per minute.

An etchant for etching silicon at high speed is a hydrofluoric acid (HF)-nitric acid ($HNO_3$) solution mixture. Only a small amount of molecules of hydrofluoric acid (HF) dissociate as represented by:

The generated fluoride ions ($F^-$) bind with neutral HF molecules, thereby generating bifluoride ions ($HF_2^-$). In the above-described solution mixture, only a very small number of bifluoride ions ($HF_2^-$) are generated, and most HF molecules remain as neutral HF molecules.

It is possible to etch silicon oxide ($SiO_2$) having a stoichiometric composition by only bifluoride ions ($HF_2^-$), but it is impossible to do so by neutral HF molecules. The oxide formed by sulfuric acid ($H_2SO_4$) on the silicon substrate surface has a composition similar to the stoichiometric composition, and cannot thus be etched by neutral HF molecules. An etching speed of the silicon substrate by an HF/$H_2SO_4$ chemical solution is significantly low. On the other hand, the silicon oxide formed on the silicon substrate surface by $HNO_3$ is an oxygen-deficient oxide, and can thus be etched by neutral HF molecules. Therefore, the speed of silicon etching is significantly high only by a hydrofluoric acid-nitric acid solution.

The reaction formula for this is:

To etch one silicon atom, 1.33 molecules of $HNO_3$ and 6 molecules of HF are consumed. One molecule of $H_2SiF_6$, 1.33 molecules of NO gas, and 2.66 molecules of water ($H_2O$) are generated as reaction products.

To uniformly etch a surface with a wide area of the silicon substrate at high speed, it is essential to remove a reaction product immediately by supplying a fresh etchant all the time. By using a single wafer processing apparatus for rotating a silicon substrate at high speed, the flow velocity of a solution flowing on the silicon substrate surface in the horizontal direction becomes very high, thereby enabling to quickly remove a reaction product from the surface. Since a time during which the solution stays on the surface of the silicon substrate surface is significantly short, an etchant which provides a very high etching speed is essential to perform efficient etching. An etchant is supplied to the silicon substrate surface by disposing a plurality of chemical solution supply nozzles from near the center toward the peripheral portion. Since the area of the silicon substrate to be etched becomes effectively wider toward the peripheral portion, it is necessary to increase the amount of a chemical solution supplied from a nozzle toward the peripheral portion.

It is definitely important in terms of apparatus design to calculate an amount of a chemical agent to be used and an amount of a reaction product to be generated when etching a silicon substrate with a thickness of 775 μm and a diameter of 300 mm by 755 μm in one minute to create a substrate with a thickness of 20 μm.

The reaction formula is:

$$3Si + 4HNO_3 + 18HF = 3H_2SiF_6 + 4NO + 8H_2O$$

To etch one Si atom, 1.33 molecules of $HNO_3$ and 6 molecules of HF are consumed. As the reaction products, 1.33 molecules of NO gas and 1 molecule of $H_2SiF_6$ are generated. The amount of silicon consumed by one 300-mm silicon substrate is $\pi \times 15^2 \times 0.0755 = 53.34$ cm$^3$. Since the specific gravity of silicon is 2.33 g/cm$^3$, the weight of silicon to be etched is 124 g. Since the number of silicon atoms per unit volume is $5 \times 10^{22}$/cm$^3$, the number of silicon atoms to be etched on one silicon substrate is $2.67 \times 10^{24}$.

Hence, $3.55 \times 10^{24}$ molecules of nitric acid and $1.6 \times 10^{25}$ molecules of HF are consumed when processing one 300-mm silicon substrate. On the other hand, $2.67 \times 10^{24}$ molecules of $H_2SiF_6$ and $3.55 \times 10^{24}$ molecules of NO gas are generated as reaction products. $2.69 \times 10^{19}$ molecules of gas are contained in 1 cm$^3$ of gas at 0° C. and atmospheric pressure. The amount of generated NO gas is $1.32 \times 10^5$ cm$^3$=132 L. If a 300-mm wafer is etched by 755 μm in one minute, NO gas is generated at 132 L/min from the surface of a silicon substrate with a diameter of 300 mm. The ultra high-speed wet etching apparatus of the present invention incorporates the idea of overcoming all the above problems.

To remove, as quickly as possible, NO gas generated at a rate of 132 L/min, clean air is supplied to the surface of the silicon substrate at about 300 to 500 L/min to exhaust the gas by a coarse vacuum pump. If clean air is supplied at 500 L/min to exhaust the gas by a coarse vacuum pump at 2,000 L/min, $$f(sccm) = 79 \times p(Torr) \times s(\text{l/sec}) \qquad (1)$$

$$P(Torr) = \frac{6.32 \times 10^5 (\text{cm}^3/\text{min})}{79 \times \frac{2 \times 10^3}{6 \times 10^1}(\text{l/sec})} = 240 \text{ torr}$$

3Si+4HNO_3+18HF→3H_2SiF_6+4NO+8H_2O where f represents the flow rate of gas to be supplied (sccm), s represents the exhaust velocity of the pump (L/sec), and p represents the pressure of the chamber (Torr). The internal pressure of the chamber is as slightly reduced as 240 Torr.

To process one 300-mm silicon substrate, $1.6 \times 10^{25}$ molecules of HF are consumed. About a liter (1 kg) of 50 wt % HF is consumed. To remove $H_2SiF_6$ as a reaction product from the substrate surface as quickly as possible, it is necessary to rotate the silicon substrate at a speed as high as 700 to 800 rpm or higher to increase the velocity of the solution flowing on the substrate surface. In addition, the thickness of a liquid film decreases as the rotational speed increases, thereby facilitating leaving of NO gas.

With an etchant according to the present invention, an etching reaction progresses at ultra high-speed, and thus HF and $HNO_3$ are fairly quickly consumed. A plurality of nozzles for supplying an ultra high-speed etchant to the substrate surface thus become necessary to extend from the center toward the peripheral portion of the silicon substrate. Furthermore, since the area of the silicon substrate surface to be etched increases toward the peripheral portion, the amount of an etchant to be supplied also increases. The number of etchant supply nozzles disposed on the silicon substrate surface is preferably four or larger for a 200-mm wafer, and six or larger for a 300-mm wafer.

Since NO gas continues to be vigorously generated from the silicon substrate surface, an etchant may splash if it is supplied perpendicularly to the silicon substrate surface. It is, therefore, preferable that one nozzle at the center supplies an etchant perpendicularly to the silicon substrate surface, and the etchant supply direction of a nozzle is tilted more along the rotation direction of the silicon substrate toward the peripheral portion to supply the etchant.

The tilt angle of the etchant emission direction from a nozzle preferably increases toward the peripheral portion. To this end, as will be described with reference to FIGS. 3A to 3E, the tilt angle of the second nozzle is set to about 30°, the tilt angle of the third and fourth nozzles is set to about 45°, and the tilt angle of the fifth and sixth nozzles is set to about 60° in a more preferable embodiment. Furthermore, the liquid flow on the silicon substrate is more turbulent near the etchant spray portion. It is, therefore, preferable that etchant supply nozzles are disposed on four arms so that the effective distance between the plurality of nozzles is long, and the distances from the center are adjusted.

Etching is quickly stopped by stopping supply of an etchant from each nozzle, and supplying a large amount of ultrapure water from another nozzle disposed at the center. One ultrapure water supply nozzle needs to be provided at the center to quickly stop etching.

Cup 1 disposed near the rotated substrate recovers a waste liquid when performing ultra high-speed etching for the silicon substrate. Since the waste liquid contains a large amount of silicon (Si) and fluorine (F), it is directed to a recovery apparatus for silicon and fluorine. Cup 2 recovers a cleaning waste liquid when stopping supply of an etchant and supplying ultrapure water and thereby stopping etching as well as cleaning the substrate surface.

It is necessary to open or close a valve, for example, about once per minute, thereby supplying or stopping an ultra high-speed etchant and ultrapure water. As the speed of etching increases, it is necessary to quickly start/stop supply of an etchant and supply of ultrapure water. To quickly and correctly open and close a valve, an air pressure valve, desirably, a motorized valve is necessary. A motorized valve incorporating an electric double-layer capacitor is more desirable. For an incompressible fluid, if the valve is quickly opened/closed, especially if the valve is closed, the internal volume of the valve becomes small so a strong water hammer phenomenon may occur. It is, therefore, particularly desirable to use a recent valve, the effective internal volume of which does not change upon opening/closing, in order to prevent the water hammer phenomenon.

FIG. 1 shows the concentrations of hydrofluoric acid and nitric acid with which the etching speed (800 µm/min, 600 µm/min, or 400 µm/min) of silicon is obtained by a hydrofluoric acid (HF)-nitric acid ($HNO_3$) solution mixture at room temperature.

A hydrofluoric acid-nitric acid solution mixture is generated as an etchant by mixing 50 wt % HF with 70 wt % or 97 wt % nitric acid.

As an etching method, a silicon substrate with an area of 10 mm×30 mm and a thickness of 730 µm is caused to move with reciprocating twice per sec in a direction perpendicular to the substrate surface in a hydrofluoric acid-nitric acid etchant. This is done in order to immediately remove a reaction product from the substrate surface to always expose the silicon substrate surface to the fresh hydrofluoric acid-nitric acid etchant. The thickness of the substrate is measured by a laser displacement gage, and an etching amount is half the decrease amount of the thickness. FIG. 1 shows a case in which ultra high-speed etching literally is performed at room temperature and a speed as high as 400 µm/min, 600 µm/min, or 800 µm/min.

Figure 2:
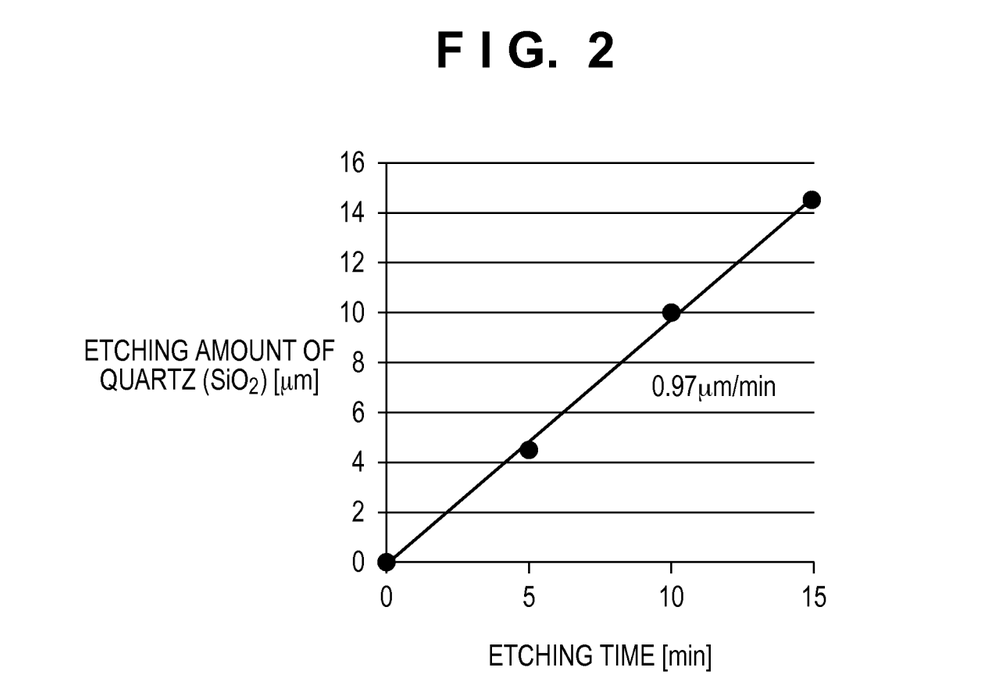
FIG. 2 is a graph showing the time dependence of the etching amount of a quartz substrate by an HF (30%)-$HNO_3$ (28%)-$H_2O$ (42%) solution which etches silicon at 800 μm/min.

FIG. 2 shows the time dependence of the etching amount of a quartz substrate by an HF (30 wt %)-$HNO_3$ (28 wt %)-$H_2O$ (42 wt %) solution when etching silicon at 800 µm/min.

The quartz substrate with the same dimensions as those of the silicon substrate was etched by the completely same method as that for the silicon substrate. However, the etching speed is 0.97 µm/min which is lower than 1 µm/min, and the speed for quartz (SIO2) is 1/800 of the speed for silicon or lower.

Figure 3A:
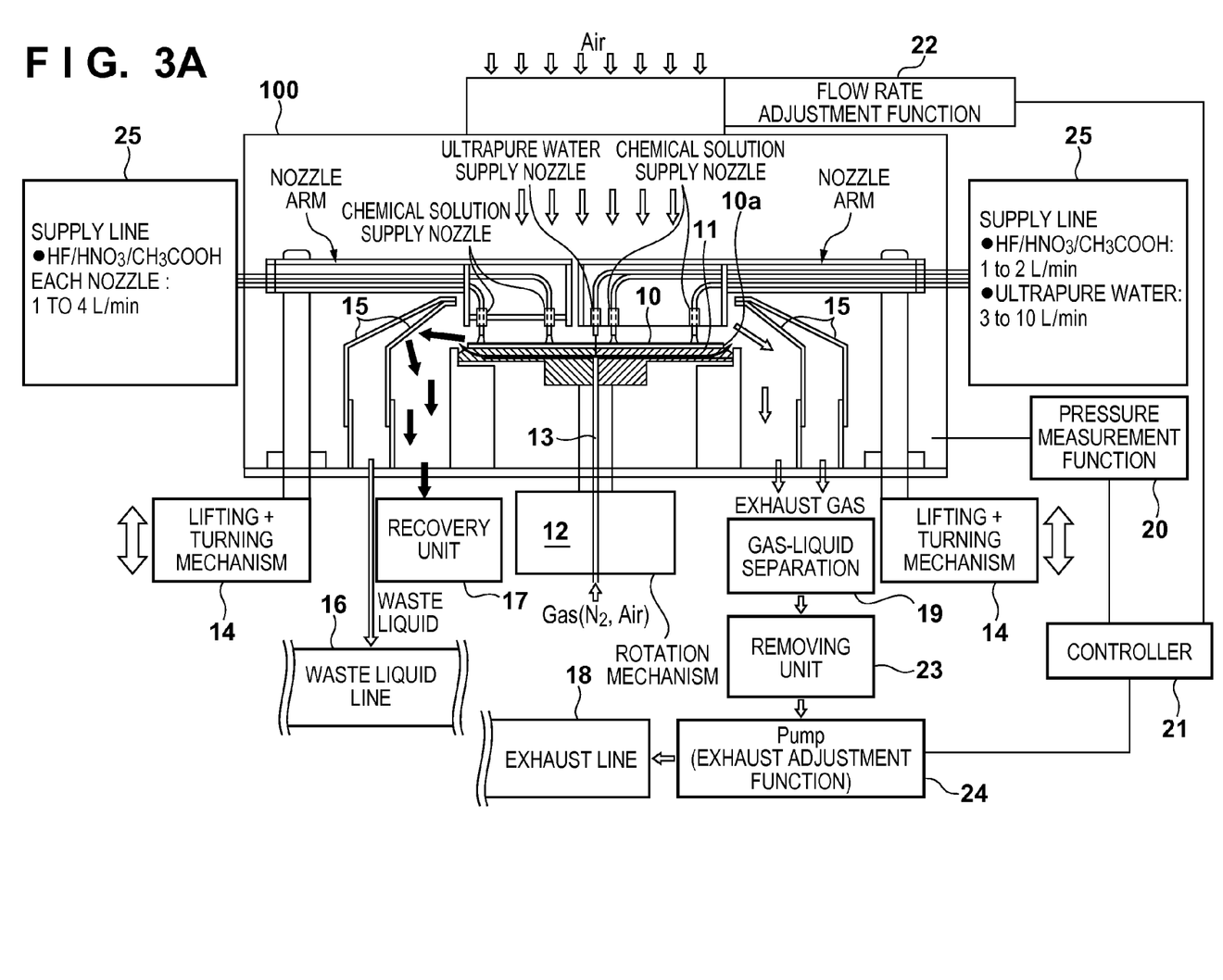
FIG. 3A is an overall view (a sectional view taken along a line "B-B" shown in FIG. 3D) schematically showing an etching process chamber 100.

FIG. 3A is an overall view (a sectional view taken along a line "B-B" shown in FIG. 3D) showing an etching process chamber 100. The etching process chamber 100 includes a stage 11 for supporting a silicon substrate 10, a rotation mechanism 12 for rotating the stage 11, and a line 13 for supplying a gas to prevent a chemical solution from flowing to an upper side 10a which is the opposite side of the back surface of the silicon substrate 10 to be processed. The chamber 100 also includes four arms for supplying a chemical solution to the back surface as a processing surface of the silicon substrate 10, on which a plurality of chemical solution supply nozzles are disposed. Each arm has a lifting mechanism/turning mechanism 14 so that a nozzle can supply a chemical solution to an appropriate position on the processing surface of the silicon substrate 10. A supply line 25 includes valves for supplying and stopping a chemical solution and ultrapure water, and each valve has a water hummer prevention function of preventing the water hammer phenomenon which may occur when supplying a chemical solution and ultrapure water. A motorized valve incorporating an electric double-layer capacitor is required in order to quickly and correctly open/close a valve. The water hummer phenomenon occurs if the internal volume of the valve becomes small when an incompressible fluid is used and especially the valve is closed. As the above-described water hummer prevention function, a valve, the internal volume of which does not change upon opening/closing, is used.

A cup 15, a waste liquid line 16, and a recovery unit 17 for exhausting a chemical solution which has been supplied to the processing surface of the silicon substrate 10 and used to etch the silicon substrate, and an exhaust line 18 for exhausting gas generated by the etching processing communicate with each other. A gas-liquid separation function 19 separates a waste liquid and exhaust gas from each other and exhausts them. There are provided a pressure measurement function 20 of measuring the internal pressure of the etching process chamber 100, a controller 21 for controlling the pressure, and a flow rate adjustment function 22 of supplying gas (clean air) to exhaust reaction produced gas and the like from the chamber 100, and adjusting the supply amount of the gas. In an exhaust line, a removing unit 23 for removing the gas generated by etching processing and an exhaust adjustment function 24 (for example, a pump) for immediately exhausting the gas from the etching process chamber 100 are arranged.

Figure 3B:
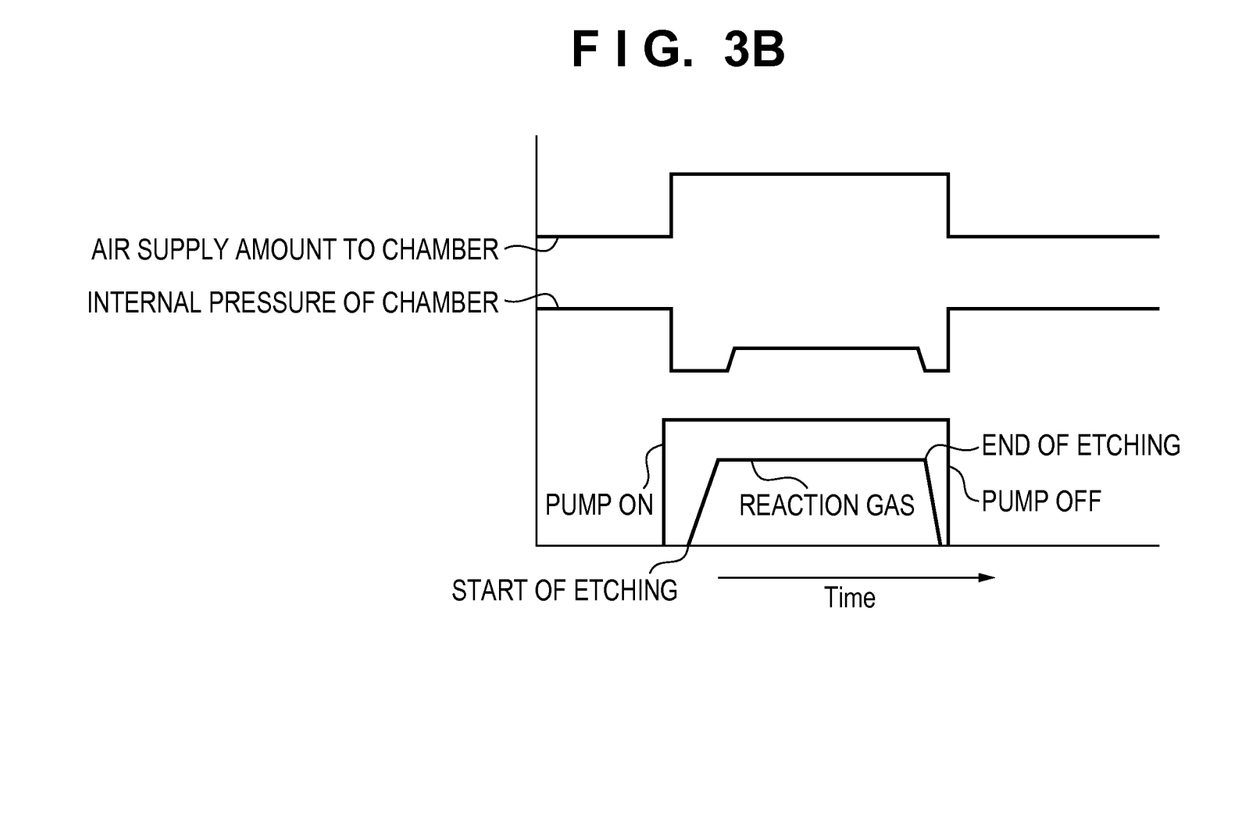
FIG. 3B is a timing chart for explaining an example of pressure control of the etching process chamber.

FIG. 3B shows an example of pressure control of the etching process chamber. In the present invention, a large amount of NO gas is generated by etching. It is necessary to quickly exhaust the generated gas outside the chamber. To do this, a pump is provided in the exhaust line of the chamber. Before the start of etching, the pump is operated to change an air supply amount to the chamber from an amount in a standby state to that in etching. Upon completion of etching, the operation of the pump is stopped and the air supply amount to the chamber is returned to the amount in the standby state.

Figure 3C:
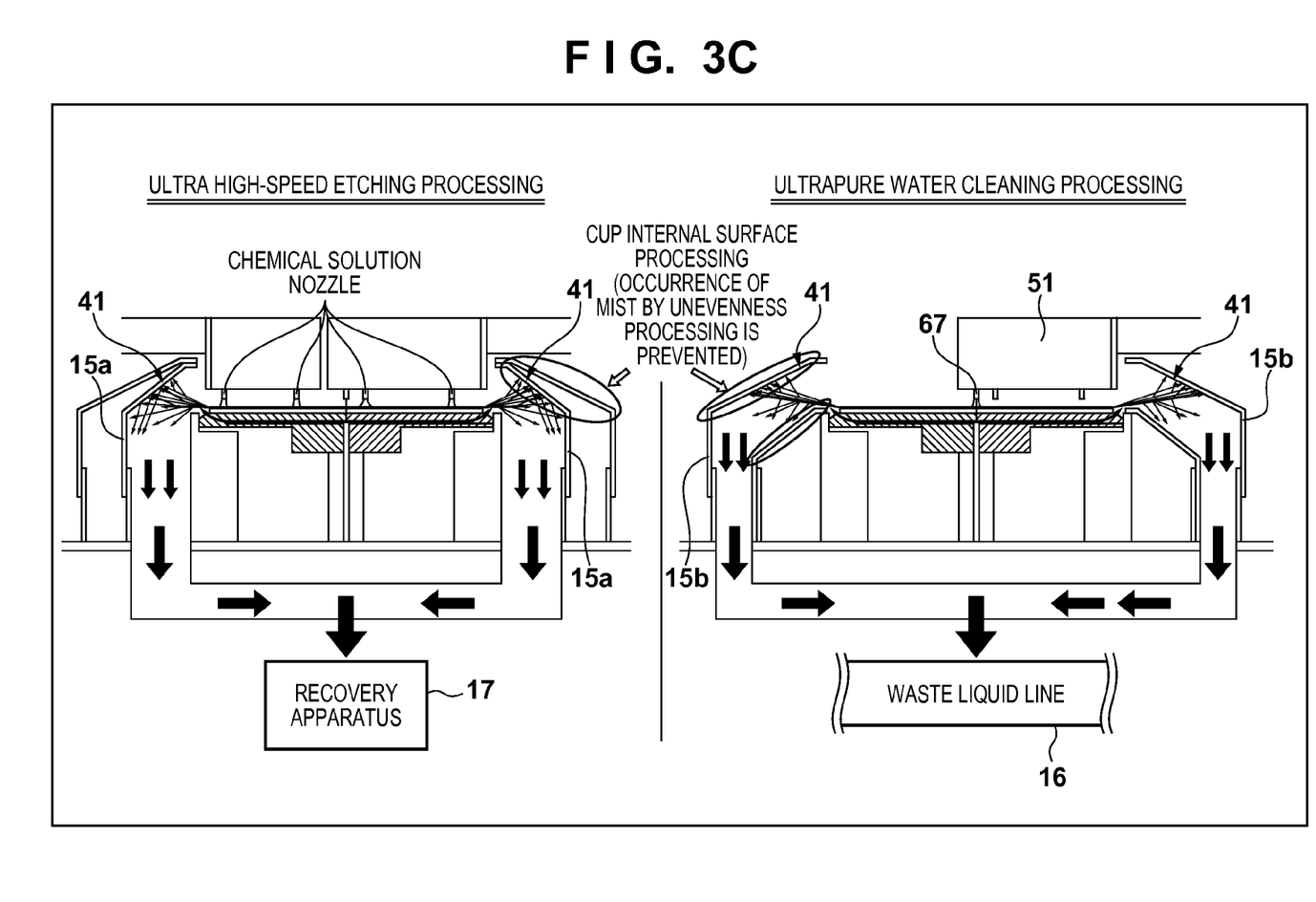
FIG. 3C is a schematic sectional view taken along the line "B-B" shown in FIG. 3D for explaining ultra high-speed etching, and ultrapure water cleaning solution supply and waste liquid processing.
Figure 3D:
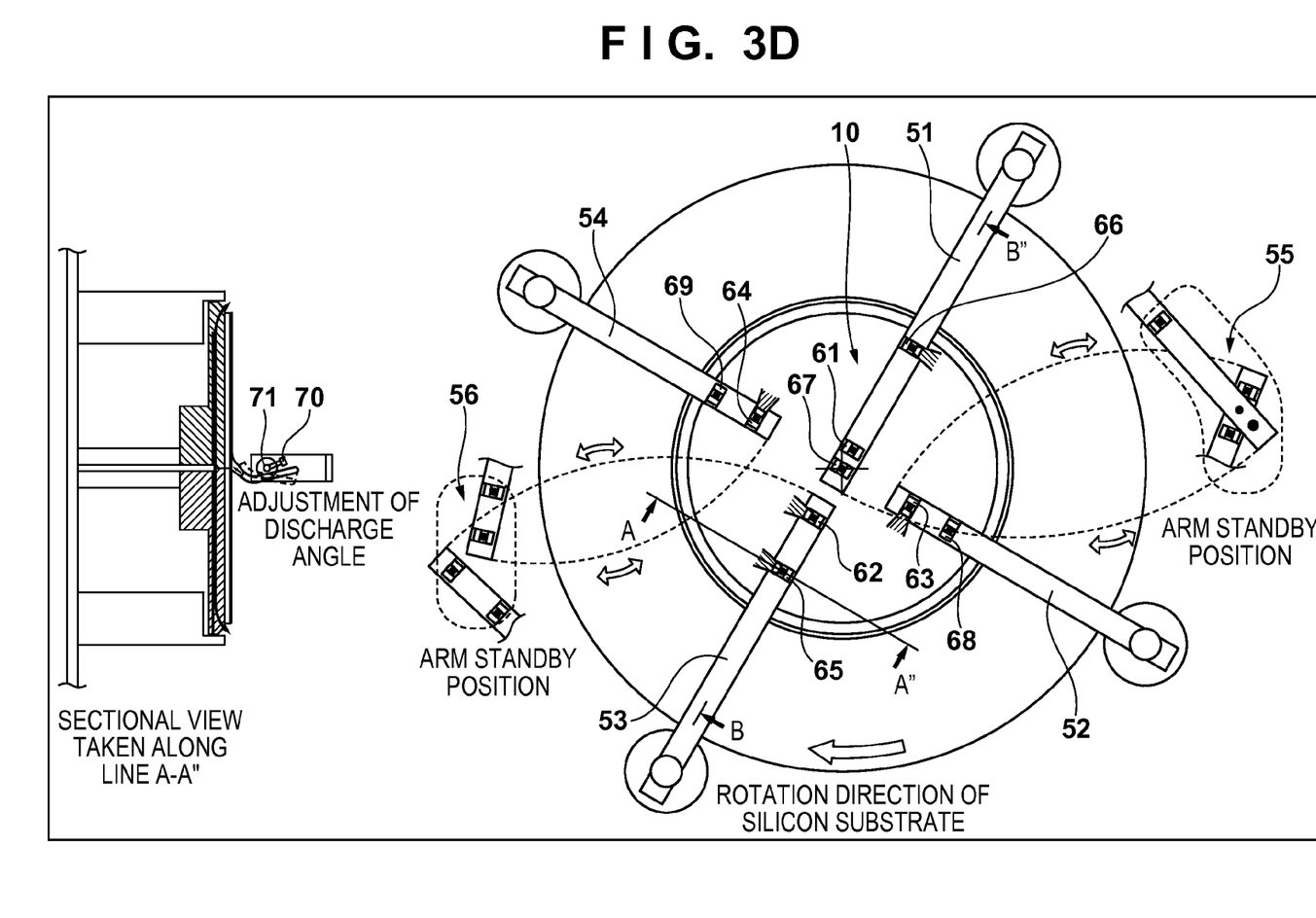
FIG. 3D is a schematic view for explaining an example of the chemical solution supply arms and nozzles of the etching process chamber.

FIG. 3C is a sectional view taken along the line "B-B" shown in FIG. 3D for explaining ultra high-speed etching, and ultrapure cleaning solution supply and waste liquid processing. A description will be provided with reference to FIG. 3C. The cup 15 for guiding a waste liquid and exhaust gas in the etching process chamber 100 has a two-stage structure. An inner cup 15a is used in ultra high-speed etching processing, and an outer cup 15b is used in ultrapure water cleaning processing. As for switching between the cups 15a and 15b, only a necessary cup is opened in a cup lifting operation, and both the cups are closed in a standby state. The inner cup 15a supplies a chemical solution used in ultra high-speed etching processing to the recovery apparatus 17, thereby enabling to reuse the chemical solution. The liquid used in ultrapure water cleaning processing flows into the waste liquid line 16. A tapered surface 41 where the chemical solutions of the cups 15a and 15b meet with each other is uneven, thereby preventing the chemical solutions from splashing to form droplets or a mist and scatter on the surface of the silicon substrate 10 or in the etching process chamber 100.

FIG. 3D shows an example of the chemical solution supply arms and nozzles of the etching process chamber. There are provided a plurality of chemical solution supply nozzles each for discharging a chemical solution to a wafer. The nozzles are disposed on the arms. Providing a plurality of nozzles enables to appropriately supply a different amount and composition of a chemical solution to each of a plurality of positions on the wafer surface. Four arms with different angles by about 90° respectively are disposed. Each arm has a turning function with the center of a rotation axis, and a lifting operation function. An arm including a chemical solution to be supplied is moved to a chemical solution supply position, thereby performing processing. Upon completion of the processing, the arm immediately moves to a standby position from the position on the silicon substrate 10. Arms 51 and 52 stand by at a standby position 55, and arms 53 and 54 stand by at a standby position 56. Each nozzle has a function of adjusting a liquid supply angle to the silicon substrate 10. A fixing bolt 70 is loosened to adjust the angle of the nozzle about a round rod-like nozzle shaft. This can adjust the flow of a chemical solution after supplying it to the silicon substrate 10, thereby preventing the solution from splashing.

A first nozzle 61 for supplying an etchant near the center (about 20 mm from the center) supplies an etchant almost perpendicularly to the processing surface of the silicon substrate. The flow rate of the etchant is about 1 L/min, and the internal diameter of a nozzle for supplying the etchant is about 4.2 mm (corresponding to ¼ inch). A second nozzle 62 is disposed on the arm 53 on the opposite side (an angle difference of about 180°) of the arm 51 on which the first nozzle 61 is disposed. The distance from the center to the second nozzle is about 50 mm, and the flow rate of the etchant it supplies is about 1 L/min. The second nozzle tilts in the rotation direction of the silicon substrate 10 by an angle of about 30°. A third nozzle 63 is disposed on the arm 52 between the nozzles 61 and 62 (an angle of 90°), the distance from the center to the third nozzle is about 75 mm, and its tilt angle is about 45°. The flow rate of the etchant it supplies is about 1.2 L/min. Furthermore, a fourth nozzle 64 is disposed on the arm 54 on the opposite side of the third nozzle 63. The distance from the center to the fourth nozzle is about 95 mm, and its flow rate is about 2 L/min. Its tilt angle is about 45°. A fifth nozzle 65 is disposed on the arm 53 on which the second nozzle is disposed. The distance from the center to the fifth nozzle is about 115 mm, its tilt angle is about 60°, and the flow rate of the etchant it supplies is about 3 L/min. A sixth nozzle 66 is attached to the arm 51 on which the first nozzle 61 is disposed. The distance from the center to the sixth nozzle is about 135 mm, its tilt angle is 60°, and the flow rate of the etchant it supplies is about 4 L/min. A nozzle 67 for supplying ultrapure water after stopping etching is disposed at almost the center of the arm 51 on which the first nozzle 61 is disposed. The flow rate of ultrapure water it supplies is 3 to 10 L/min. The etchant amount to be supplied from a nozzle varies depending on the nozzle position, and increases toward the peripheral portion. The inner diameter of a nozzle increases toward the peripheral portion so that liquid spray velocities from the nozzles are almost equal to each other.

Figure 3E:
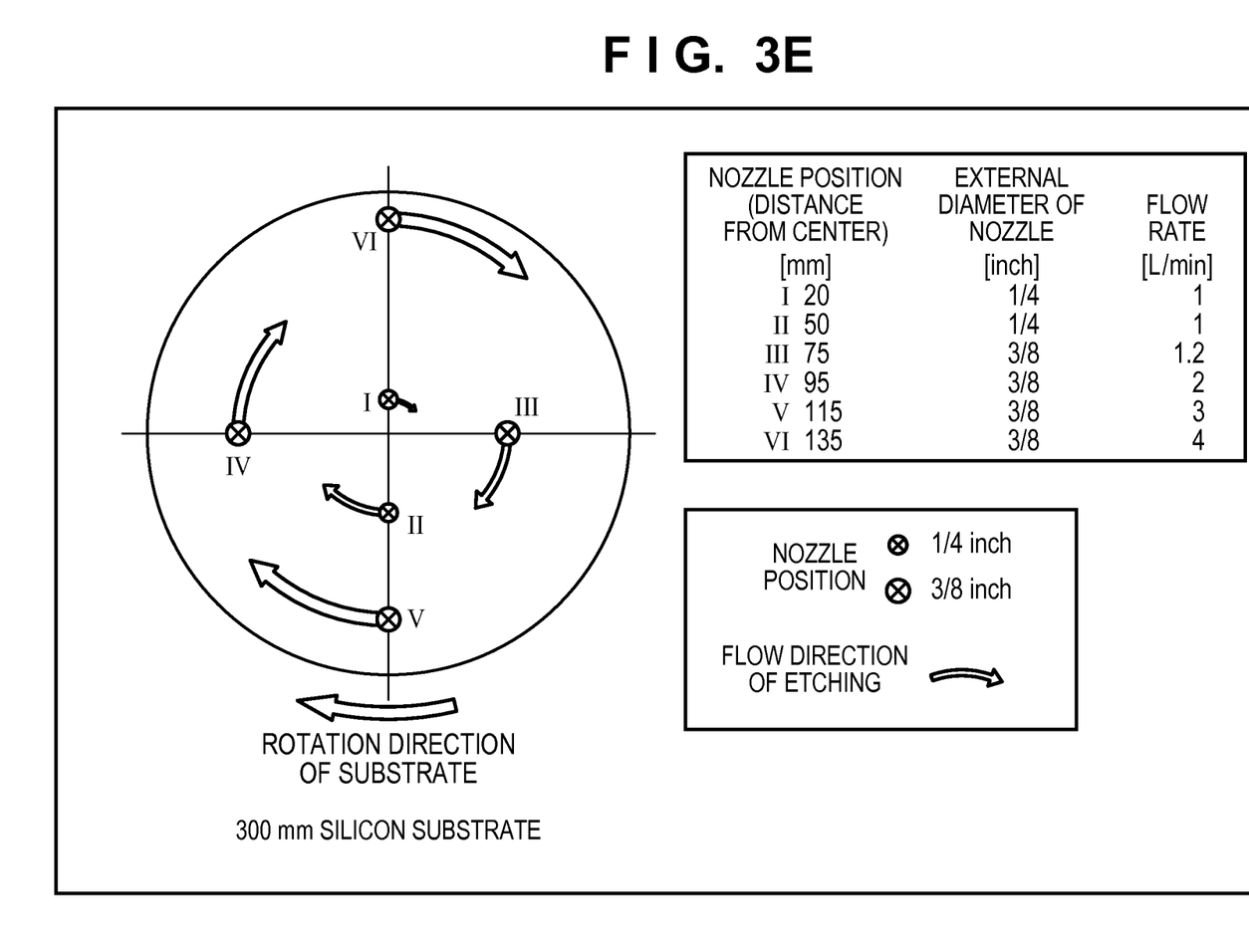
FIG. 3E is a schematic view for explaining the relationship between a nozzle position and a rotation direction.

FIG. 3E shows the relationship between the nozzle positions and the rotation direction. Assume that two different nozzles at slightly different distances from the center of the silicon substrate respectively supply a liquid. If the nozzles respectively supply the liquid at positions with a small angle difference, the flows of the liquid may interfere with each other. To prevent this problem, for example, as denoted by reference symbols I and II, and V and VI, nozzles at slightly different distances from the center of the silicon substrate respectively supply a liquid while maintaining the positional relationship of an angle difference of 180° in which the flows of the liquid least interfere with each other. Furthermore, nozzles at positions III and IV near the midpoint between the positions I and II or V and VI have an angle difference of 90° with respect to the positions I and II, and supply the liquid while maintaining the positional relationship of an angle difference of 180° with respect to each other.

Figure 4:
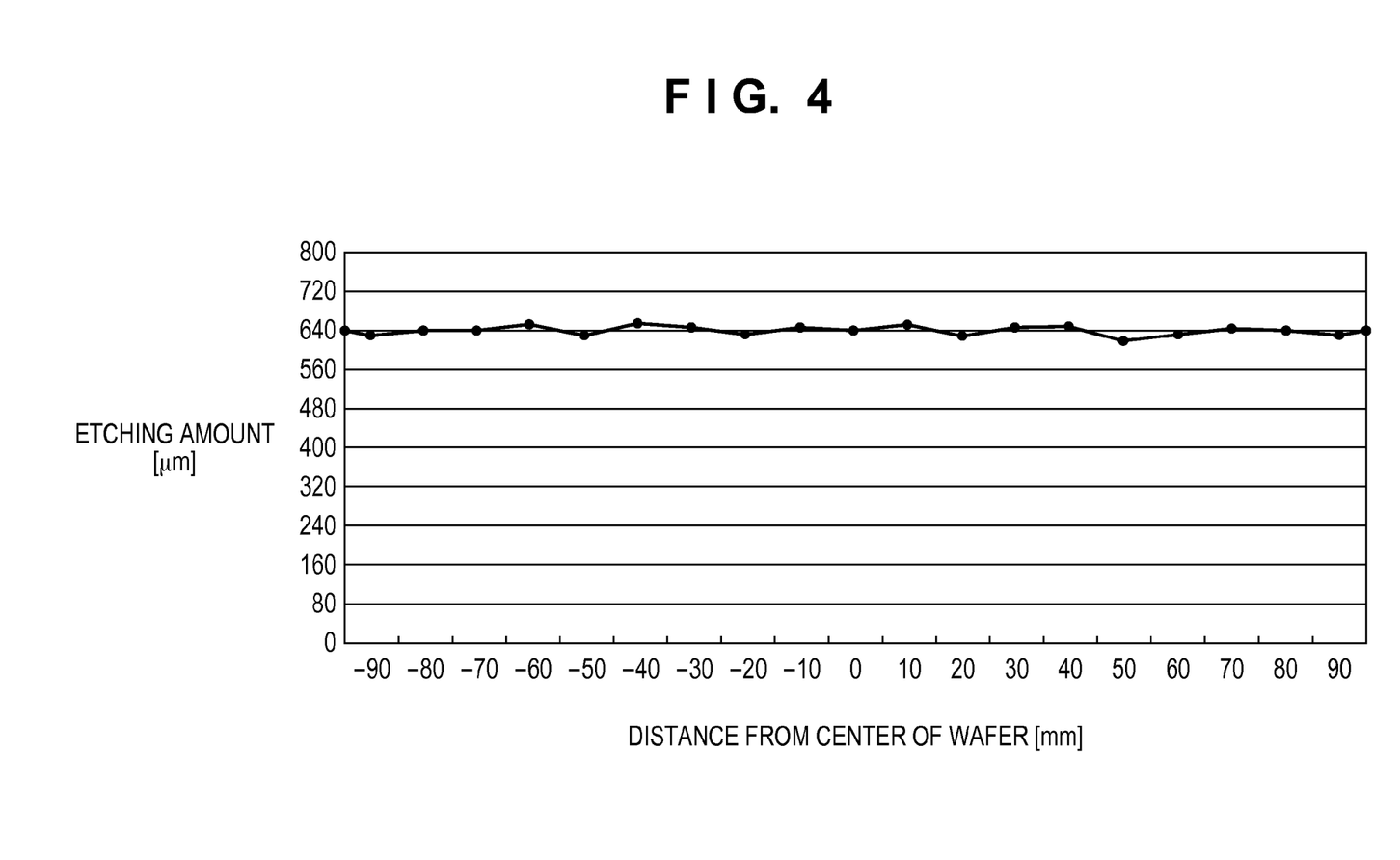
FIG. 4 is a graph showing an etching result of a silicon substrate with a thickness of 725 μm and a diameter of 200 mm.

FIG. 4 shows an etching result of a silicon substrate with a thickness of 725 μm and a diameter of 200 mm. The first nozzle is disposed at a distance of 20.5 mm from the center, the second nozzle (disposed on the arm diametrically opposite to that of the first nozzle) is disposed at a distance of 52.5 mm from the center, the third nozzle (disposed on the arm between the first and second nozzles) is disposed at a distance of 72 mm from the center, and the fourth nozzle (disposed on the arm diametrically opposite to that of the third nozzle) is disposed at a distance of 85 mm from the center. A chemical solution supplied from each nozzle is an HF (30 wt %)-HNO$_3$ (28 wt %)-H$_2$O (42 wt %) solution. The flow rate of the first nozzle is 1 L/min, that of the second nozzle is 1 L/min, that of the third nozzle is 1.2 L/min, and that of the fourth nozzle is 2 L/min.

The rotation speed of the substrate is 850 rpm. After etching for 40 sec, supply of the chemical solution from each nozzle is stopped while supplying ultrapure water from a nozzle at the center at 3 L/min, thereby stopping etching. FIG. 4 shows a case in which silicon is uniformly etched by 640 μm in 40 sec, thereby obtaining a silicon substrate with a thickness of 85 μm. This completely demonstrates that it is possible to sufficiently decrease the thickness of the silicon substrate for a significantly short time.

An etching apparatus according to the embodiment is not limited to the apparatus comprising four arms. In other words, the chamber 100 can include a plurality of arms which is not limited to four arms. In this example, each of the plurality of arms comprise an etchant supply nozzle for supplying etchant to a surface to be etched on the object, similarly to the arms 51 to 54 described above. In addition, each of the plurality of arms can be positioned in a direction substantially from a center of the stage toward a peripheral portion, similarly to the arms 51 to 54 described above. Each arm can be positioned with a substantially uniformed angle difference, for example, 90 about when there are four arms.

In this example, first etchant supply nozzle, which corresponds to the first nozzle 61, is placed on a first arm out of the plurality of arms, which corresponds to the first arm 51. This first nozzle supplies the etchant to a position nearest to the center of the object which is rotating, among positions to which each of a plurality of nozzles supplies the etchant. Furthermore, a second etchant supply nozzle, which corresponds to the second nozzle 62, is placed on a second arm out of the plurality of arms, which correspond to the arm 53. The second etchant supply nozzle supplies the etchant to a position second nearest to the center of the object, among positions to which each of a plurality of nozzles supplies the etchant. The second arm has the largest angle difference with respect to the first arm. For example, the first and the second arms are placed in opposite positions with each other across the rotatable stage.

In addition, a third etchant supply nozzle, which corresponds to the third nozzle 63, is placed on a third arm out of the plurality of arms, which corresponds to the arm 52. The third etchant supply nozzle supplies the etchant to a position on the surface to be etched on the object which is different from the positions to which the etchant is supplied from the first etchant supply nozzle or the second etchant supply nozzle. The third arm is placed between the first arm and the second arm. Other etchant supply nozzles can be placed on the first, second, or the third arm, or the other arms.

The second and the third etchant supply nozzle can be tilted with respect to the rotatable stage. For example, the second and the third can supply the etchant with tilt angles with respect to a rotating direction of the object. The first etchant supply nozzle may supply the etchant almost perpendicularly to the surface of the object to be etched, although the arrangement of the first etchant supply nozzle is not limited to this. The other etchant supply nozzles can also be tilted. The etchant supply nozzles can be arranged so that the outer etchant supply nozzle supplies the etchant with the smaller tilt angle with respect to the rotating direction of the object, in a similar manner as the nozzles 61 to 66 to prevent splashing. The etchant supply nozzles may be configured so that the outer etchant supply nozzle supplies the etchant with the higher flow rate to perform etching, in a similar manner as nozzles 61 to 66.

The present invention is not limited to the above-described embodiments, and various changes and modifications can be made without departing from the spirit and scope of the present invention. Therefore, to apprise the public of the scope of the present invention, the following claims are made.

This application claims the benefit of Japanese Patent Applications Nos. 2010-254114, filed Nov. 12, 2010, and 2011-107619, filed May 12, 2011, which are hereby incorporated by reference herein in its entirety.

What is claimed is:

1. An etching method using an etching apparatus, wherein the etching apparatus comprises:
    a rotatable stage where an object to be etched is placed; and
    four arms comprising an etchant supply nozzle for supplying etchant to a surface to be etched on the object;
    wherein the four arms can be positioned in a direction substantially from a center of the stage toward a peripheral portion with an angle difference of about 90°; and
    wherein the etching method comprises:
    supplying the etchant to a first position nearest to the center of the object which is rotating, from a first etchant supply nozzle placed on a first arm;
    supplying the etchant to a second position second nearest to the center of the object, from a second etchant supply nozzle placed on a second arm, wherein the second arm is substantially symmetrically positioned with respect to the first arm and the second arm has an angle difference of about 180° with respect to the first arm;
    supplying the etchant to a third position on the object from a third etchant supply nozzle placed on a third arm, wherein the third arm is positioned between the first arm and the second arm;
    supplying the etchant to a fourth position of the object from a fourth etchant supply nozzle placed on a fourth arm, wherein the fourth arm is substantially symmetrically positioned with respect to the third arm;
    supplying the etchant to a fifth position of the object from a fifth etchant supply nozzle placed on the second arm;
    supplying the etchant to a sixth position of the object from a sixth etchant supply nozzle placed on the first arm.

2. The etching method according to claim 1, further comprising supplying ultrapure water to the center of the object, upon stopping supplying the etchant from the etchant supply nozzle, when stopping etching.

3. The etching method according to claim 2, wherein:
    a ultrapure water supply nozzle and the first etchant supply nozzle respectively supply liquids substantially perpendicularly to the object; and
    the second etchant supply nozzle and the succeeding etchant supply nozzles respectively supply the etchant with tilt angles with respect to a rotating direction of the object, wherein an outer etchant supply nozzle supplies the etchant with the smaller tilt angle with respect to the rotating direction of the object.

4. The etching method according to claim 1, wherein an outer etchant supply nozzle supplies the etchant with the higher flow rate to perform etching.

5. The etching method according to claim 1, wherein a flowing speed of the etchant from the etchant supply nozzle to the surface to be etched on the object is substantially the same among all of the etchant supply nozzles, and an amount of the etchant is the larger at an outer etchant supply nozzle.

6. An etching method using an etching apparatus, wherein the etching apparatus comprises:
    a rotatable stage where an object to be etched is placed; and
    a plurality of arms comprising an etchant supply nozzle for supplying etchant to a surface to be etched on the object;

wherein the plurality of arms can be positioned in a direction substantially from a center of the stage toward a peripheral portion with a substantially uniformed angle difference; and wherein the etching method comprises:

supplying the etchant to a position nearest to the center of the object which is rotating, from a first etchant supply nozzle placed on a first arm out of the plurality of arms;

supplying the etchant to a position second nearest to the center of the object, from a second etchant supply nozzle placed on a second arm, wherein the second arm has the largest angle difference with respect to the first arm; and supplying the etchant to a position on the surface to be etched on the object which is different from the positions to which the etchant is supplied from the first etchant supply nozzle or the second etchant supply nozzle, from a third etchant supply nozzle on a third arm which placed between the first arm and the second arm;

wherein the second etchant supply nozzle and the third etchant supply nozzle supply the etchant with tilt angles with respect to a rotating direction of the object; and wherein an outer etchant supply nozzle supplies the etchant with the smaller tilt angle with respect to the rotating direction of the object.

7. The etching method according to claim 6, wherein the outer etchant supply nozzle supplies the etchant with the higher flow rate to perform etching.

\* \* \* \* \*